(12) United States Patent
Liu

(10) Patent No.: US 8,754,708 B2
(45) Date of Patent: Jun. 17, 2014

(54) OPERATIONAL AMPLIFIER

(75) Inventor: Ping Lin Liu, Hsinchu County (TW)

(73) Assignee: Sitronix Technology Corp., Hsinchu County (TW)

( * ) Notice: Subject to any disclaimer, the term of this patent is extended or adjusted under 35 U.S.C. 154(b) by 33 days.

(21) Appl. No.: 13/567,151

(22) Filed: Aug. 6, 2012

(65) Prior Publication Data

US 2013/0038394 A1 Feb. 14, 2013

(30) Foreign Application Priority Data

Aug. 8, 2011 (TW) .............................. 100128086 A

(51) Int. Cl.
*H03F 3/45* (2006.01)
(52) U.S. Cl.
USPC .......................................... 330/257; 330/255
(58) Field of Classification Search
USPC .................. 330/257, 255, 261, 260
See application file for complete search history.

(56) References Cited

U.S. PATENT DOCUMENTS

| 5,365,194 | A  | * | 11/1994 | Sands, Jr. ....................... 330/253 |
| 6,300,833 | B1 | * | 10/2001 | Vyne et al. .................... 330/257 |
| 6,384,685 | B1 | * | 5/2002  | Juang ............................. 330/264 |
| 7,453,318 | B2 | * | 11/2008 | Higuchi ........................ 330/255 |
| 7,855,600 | B2 | * | 12/2010 | An et al. ....................... 330/255 |
| 8,368,673 | B2 | * | 2/2013  | Tsai et al. ..................... 345/204 |

* cited by examiner

*Primary Examiner* — Henry Choe
(74) *Attorney, Agent, or Firm* — Rosenberg, Klein & Lee

(57) ABSTRACT

The present invention relates to an operational amplifier comprising an input-stage circuit, a floating current mirror circuit, and an output-stage circuit. The input-stage circuit receives an input signal and produces a control signal. The floating current mirror circuit is coupled to the input-stage circuit, and produces a mirror current according to the control signal. The output-stage circuit is coupled to the floating current mirror circuit, and produces a driving signal according to the mirror current. When the operational amplifier is operating in the static mode, the output-stage circuit further produces a static current according to the mirror current. Thereby, by using the floating current mirror circuit, the purpose of low power consumption can be achieved while driving to the high-voltage mode or to the low-voltage mode.

8 Claims, 12 Drawing Sheets

US 8,754,708 B2

OPERATIONAL AMPLIFIER

FIELD OF THE INVENTION

The present invention relates generally to an operational amplifier, and particularly to an operational amplifier having low power consumption.

BACKGROUND OF THE INVENTION

Modern technologies are developing prosperously. Novel information products are introduced for satisfying the diversified needs of many people. Early displays are mainly cathode ray tube (CRT) displays. They have huge size and consume a great deal of power. In addition, the radiation they produced is harmful to the health of long-term users. Accordingly, the CRT displays in the market are gradually replaced by liquid crystal displays (LCDs), which have the advantages of small size, low radiation, and low power consumption and hence have become the mainstream of the market.

LCDs are a kind of flat panel displays (FPDs) having light and thin outlines. Thanks to their advantages of low radiation, small volume, and low power consumption, they have gradually replaced the traditional CRTs and applied extensively to information products such as notebook computers, personal digital assistants (PDAs), flat-screen TVs, or mobile phones. An LCD comprises a liquid crystal panel, a timing controller (ICON), a gate driver, and a source driver. The TCON is used for producing image data signal and driving the control signal and timing signal required by the liquid crystal panel. The gate driver is used for producing the scanning signal for turning on or off the pixel circuit array. Besides, the source driver produces the driving signal of the liquid crystal panel according to the image data signal, the control signal, and the timing signal.

Current driver chips of liquid crystal panels are developing towards high resolution; each stage of source is output by an operational amplifier for driving the load. Because high resolution requires more operational amplifiers, there will be a substantial static current produced by the operational amplifiers. For solving the problem, the only method is to limit the static operational current of the operational amplifier within a very small range. Nonetheless, the operational amplifiers according to the prior art adopt the floating source follower method to control the output static current. Under this architecture, the operational amplifiers tend to output excessive static current owing to process variations, and thus leading to excessive static power consumption.

Accordingly, the present invention provides a novel operational amplifier capable lowering power consumption effectively. The problem described above can hence be solved.

SUMMARY

An objective of the present invention is to provide an operational amplifier, which uses a floating current mirror circuit for achieving the purpose of low power consumption while driving to the high-voltage mode or to the low-voltage mode.

Another objective of the present invention is to provide an operational amplifier, which uses a floating current mirror circuit and a current control unit for producing extremely low static current while the operational amplifier is operating in the static mode and thus achieving the purpose of low power consumption The operational amplifier according to the present invention comprises an input-stage circuit, a floating current mirror circuit, and an output-stage circuit. The input-stage circuit receives an input signal and produces a control signal. The floating current mirror circuit is coupled to the input-stage circuit, and produces a mirror current according to the control signal. The output-stage circuit is coupled to the floating current mirror circuit, and produces a driving signal according to the mirror current. When the operational amplifier is operating in the static mode, the output-stage circuit further produces a static current according, to the mirror current. Thereby, by using the floating current mirror circuit, the purpose of low power consumption can be achieved while driving to the high-voltage mode or to the low-voltage mode.

The operational amplifier according to another embodiment of the present invention comprises art input-stage circuit, a floating current mirror circuit, a current control unit, and an output-stage circuit. The input-stage circuit receives an input signal and produces a control signal. The floating current mirror circuit is coupled to the input-stage circuit, and produces a mirror current according to the control signal. The current control unit is coupled to the floating current mirror circuit, and produces a control current according to the mirror current. The output-stage circuit is coupled to the current control unit, and produces a driving signal according to the control current produces by the current control unit. When the operational amplifier is operating in the static mode, the output-stage circuit further produces a static current according to the control current. Thereby, by using the floating current mirror circuit and the current control unit, an extremely low static current is produced while the operational amplifier is operating in the static mode, and hence the purpose of low power consumption can be achieved.

DETAILED DESCRIPTION

In order to make the structure and characteristics as well as the effectiveness of the present invention to be further understood and recognized, the detailed description of the present invention is provided as follows along with embodiments and accompanying figures.

Figure 1:
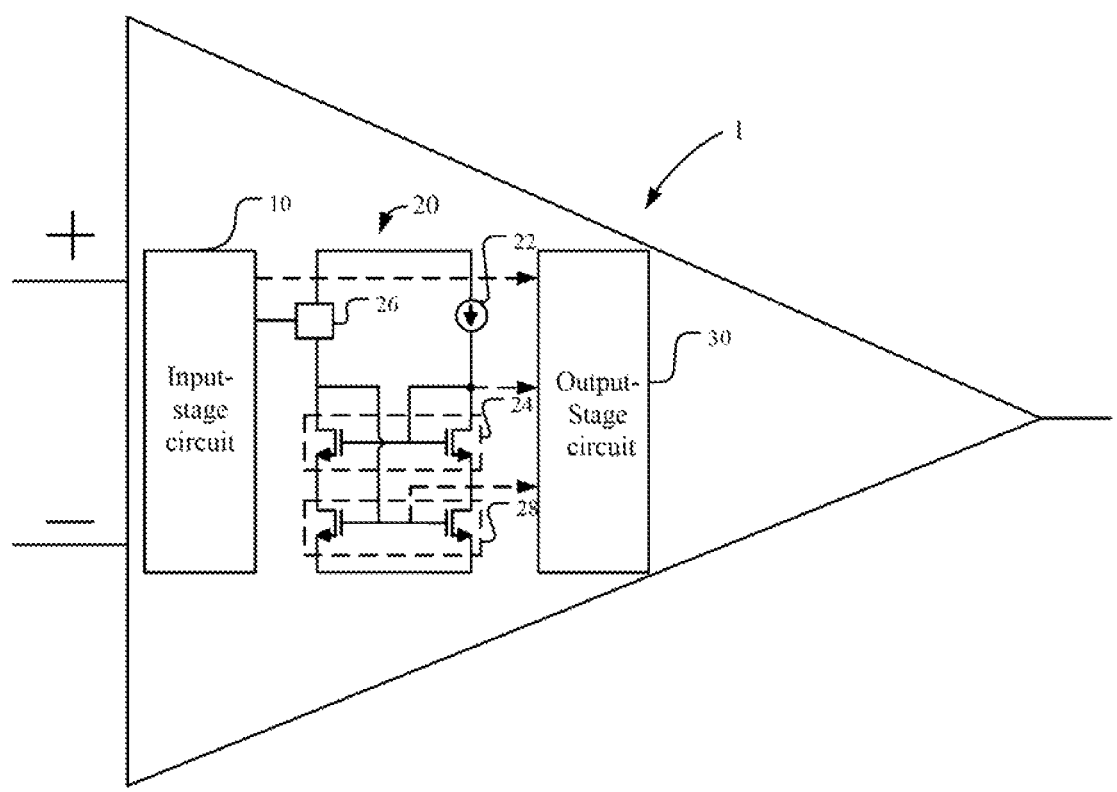
FIG. 1 shows a schematic diagram of the operational amplifier according to an embodiment of the present invention.
Figure 2:
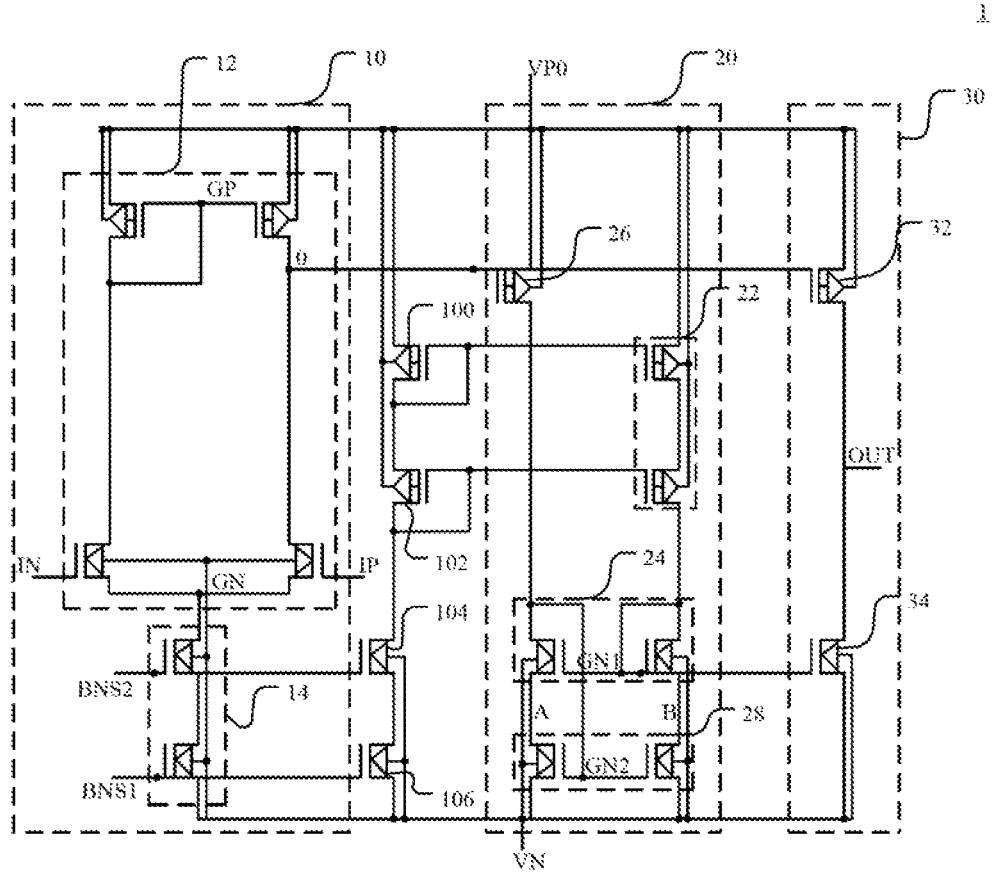
FIG. 2 shows a circuit diagram of the operational amplifier according to an embodiment of the present invention.

FIG. 1 and FIG. 2 show a schematic diagram and a circuit diagram of the operational amplifier according to an embodiment of the present invention. As shown in the figures, the operational amplifier 1 according to the present embodiment comprises an input-stage circuit 10, a floating current mirror circuit 20, and an output-stage circuit 30. The input-stage circuit 10 receives an input signal and produces a control signal. The floating current mirror circuit 20 is coupled to the input-stage circuit 10, and produces a mirror current according to the control signal. The output-stage circuit 30 is coupled to the floating current mirror circuit 20, and produces a driving signal according to the mirror current. When the operational amplifier 1 is operating in the static mode, the output-stage circuit 30 further produces a static current according to the mirror current. Thereby, by using the floating current mirror circuit 20, the purpose of low power consumption can be achieved while driving to the high-voltage mode, namely, driving a low-voltage level to a high-voltage level, or driving to the low-voltage mode, namely, driving a high-voltage level to a low-voltage level.

The floating current mirror 20 described above comprises a current source 22, a current mirror unit 24, a control device 26, and a voltage control unit 28. The current source 22 is used for producing a current $I_{bias1}$. The current mirror unit 24 is coupled to the current source 22, and produces a mirror current $I_{bias2}$ according to the current $I_{bias\ 1}$ produced by the current source 22. The control device 26 is coupled to the input-stage circuit 10 and the current mirror unit 24, and controls the current mirror unit 24 to produce the mirror current $I_{bias2}$ according to the control signal. The voltage control signal controls the output-stage circuit 30 to produce the driving signal or the static current.

Figure 3A:
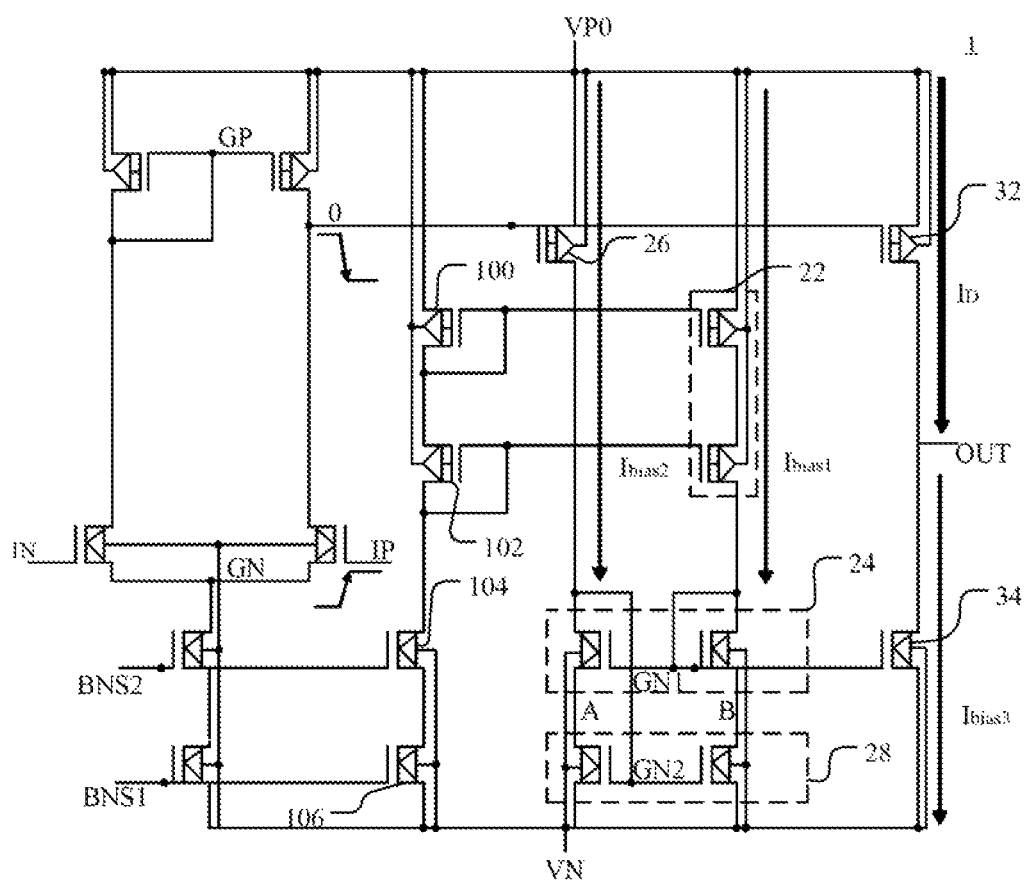
FIG. 3A shows the operation of the operational amplifier in FIG. 1 according to an embodiment of the present invention.
Figure 3B:
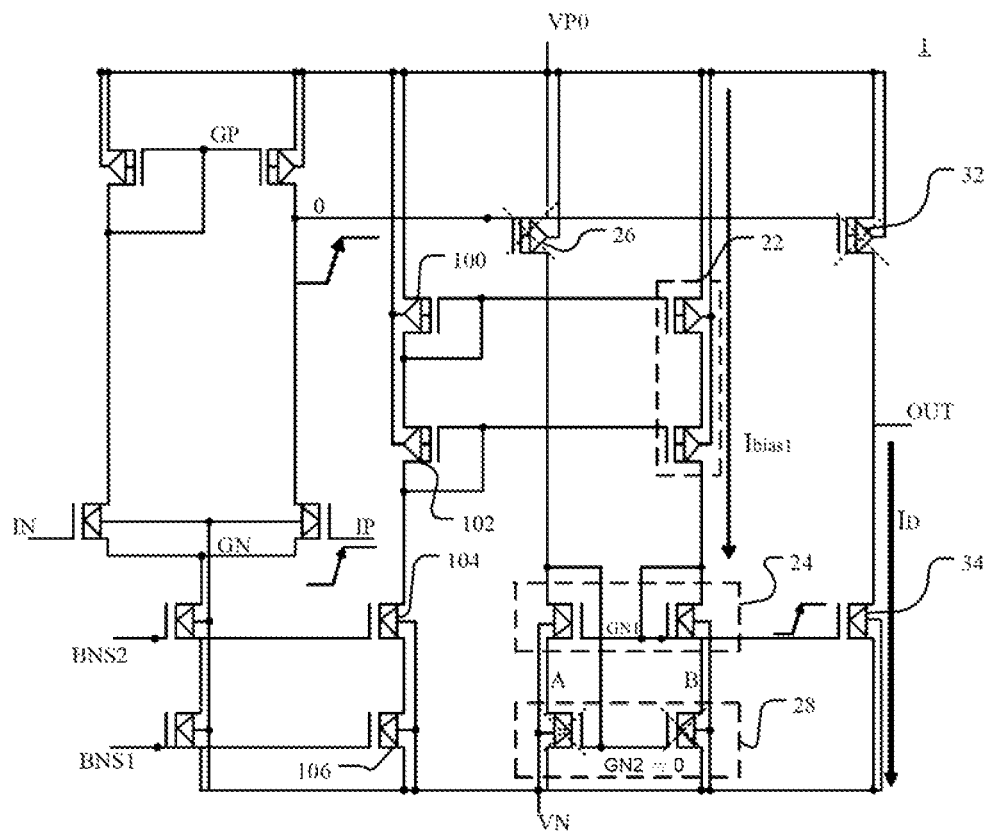
FIG. 3B shows the operation of the operational amplifier in FIG. 1 according to another embodiment of the present invention.
Figure 3C:
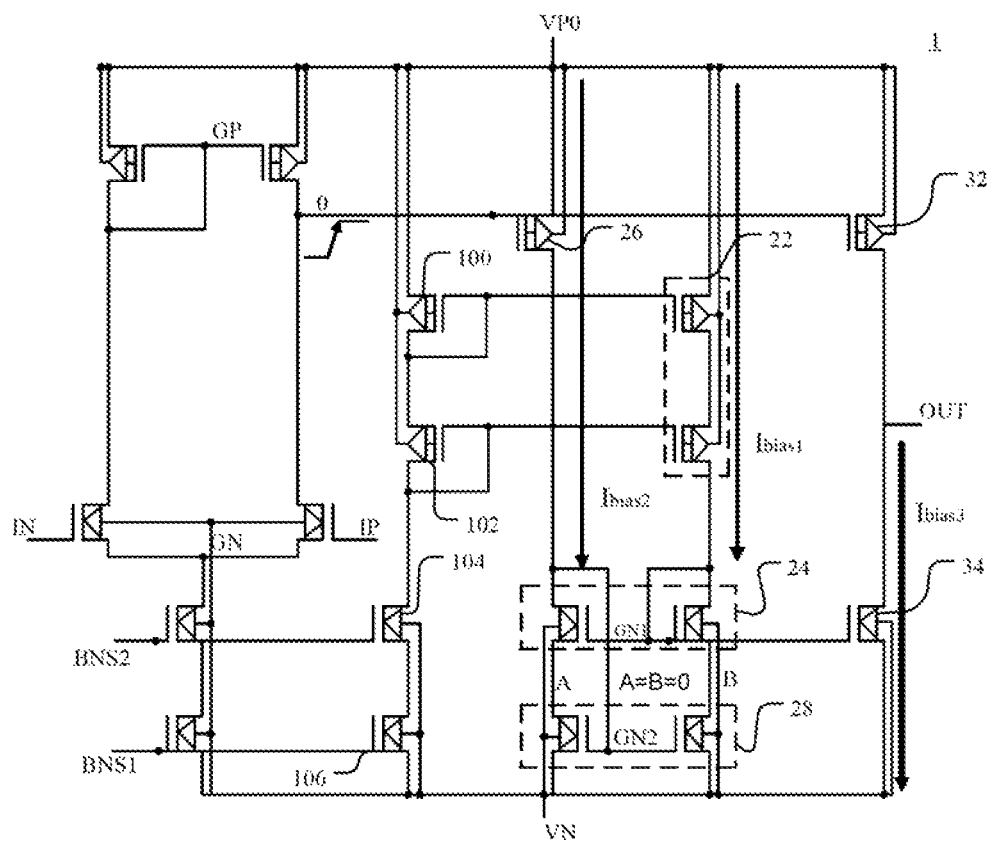
FIG. 3C shows the operation of the operational amplifier in FIG. 1 according to another embodiment of the present invention.

In addition, the output-slime circuit 30 includes a first transistor 32 and a second transistor 34. The first transistor 32 is coupled to the input-stage circuit 10 and controlled by the control signal. The second transistor 34 is coupled to the first transistor 32 and the floating current mirror 20 and controlled by the mirror current $I_{bias2}$ produced by the floating current mirror circuit 20. In FIGS. 3A to 3C, the operations of driving the operational amplifier to the high- and low-voltage modes and operating in static mode are described, respectively.

FIG. 3A shows the operation of the operational amplifier in FIG. 1 according to an embodiment of the present invention. As shown in the figure, the operational amplifier 1 according to the present embodiment is operating to drive to the high-voltage mode. In other words, the operational amplifier 1 outputs a high-voltage signal. The control device 26 receives the control signal and is turned on, enabling the current mirror unit 24 to operate normally and mirror the current $I_{bias1}$ of the current source 22 for producing the mirror current $I_{bias2}$. At this moment, because the voltage control unit 28 is turned on, the voltage control unit 28 is driven to operate in the linear region and thus making the voltage between the current mirror unit 24 and the voltage control unit 28 zero. That is to say, the voltage between the nodes A, B located between the current mirror unit 24 and the voltage control unit 8 is zero, thereby the current $I_{bias3}$ flowing through the second transistor 34 of the output-stage circuit 30 is extremely small or even approximates to zero. Meanwhile, the first transistor 32 produces a strong driving signal $I_D$ to the output and thus making the operational amplifier 1 operate to drive to the high-voltage mode.

FIG. 3B shows the operation of the operational amplifier in FIG. 1 according to another embodiment of the present invention. As shown in the figure, the operational amplifier 1 according to the present embodiment is operating to drive to the low-voltage mode. In other words, the operational amplifier 1 outputs a low-voltage signal. The control device 26 is cut off according to the voltage level of the control signal, which makes the current mirror unit 24 stop operating and stop producing the mirror current $I_{bias2}$. According to the present embodiment, the control signal is in the high-voltage level. The gate of the control device 26 receives the control signal and then cuts off the control device 26. At this moment, because the control device 26 is cut off, the voltage control unit 28 is cut off accordingly and the second transistor 34 of the output-stage circuit 30, in turn, is turned on. Then, because the control signal is in the high-voltage level, the first transistor 32 of the output-stage circuit 30 is cut off, which makes the output-stage circuit 30 to output a low voltage and thus the operational amplifier 1 is operating in the low-voltage mode.

FIG. 3C shows the operation of the operational amplifier in FIG. 1 according to another embodiment of the present invention. As shown in the figure, the operational amplifier 1 according to the present embodiment is operating in the static mode. The control device 26 receives the control signal and is turned on, enabling the current mirror unit 24 to operate normally and mirror the current $I_{bias1}$ of the current source 22 for producing the current $I_{bias2}$. At this time, because the voltage control unit 28 is turned on, the voltage control unit 28 is driven to operate in the linear region and thus making the voltage between the current mirror unit 24 and the voltage control unit 28 zero. That is to say, the voltage between the nodes A, B located between the current mirror unit 24 and the voltage control unit 28 is zero, thereby the current $I_{bias3}$ flowing through the second transistor 34 of the output-stage circuit 30 is extremely small or even approximates to zero. Consequently, the static current is extremely small and thus achieving the purpose of low power consumption. Thereby, by using the floating current mirror circuit 24 and the voltage control unit 28, an extremely low static current is produced while the operational amplifier 1 is operating in the static mode, and hence the purpose of low power consumption can be achieved.

Refer again to FIG. 2. The input-stage circuit 10 according to the present invention includes a differential unit 12 and a current source 14. The differential unit 12 receives the input signal and produces the control signal. The current source 14 is coupled to the differential unit 12. Besides, the input-stage circuit 10 further includes transistors 100, 102, 104, 106. The transistor 100 is coupled to a power supply VP0 and the current source 22. The transistor 102 is connected in series with the transistor 100 and to the current source. The transistor 104 and the transistor 106 are connected in series, and are connected in series with the transistor 102 for providing a bias voltage to the current source 22. Moreover, the current source 22 can also be coupled to the differential unit 12 of the input-stage circuit 10. Then the differential unit 12 can provide the bias voltage to the current source 22.

Figure 4:
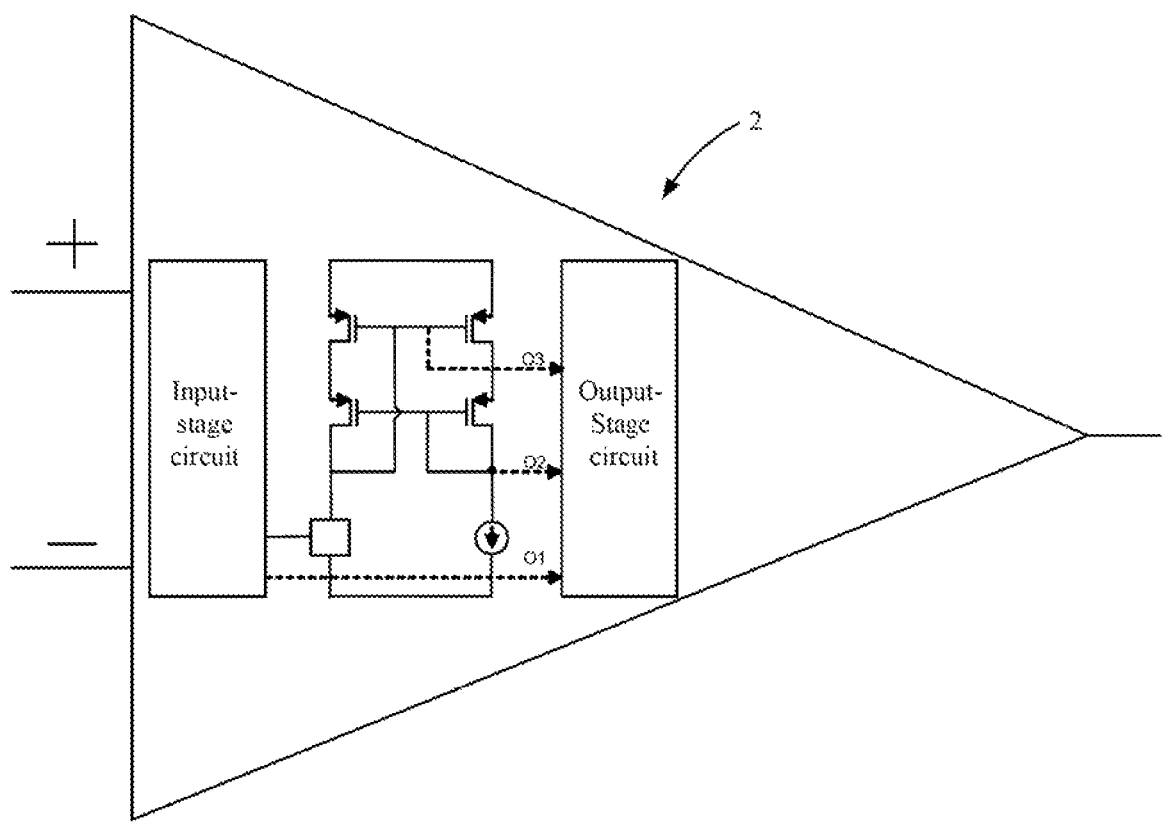
FIG. 4 shows a schematic diagram of the operational amplifier according to another embodiment of the present invention.
Figure 5:
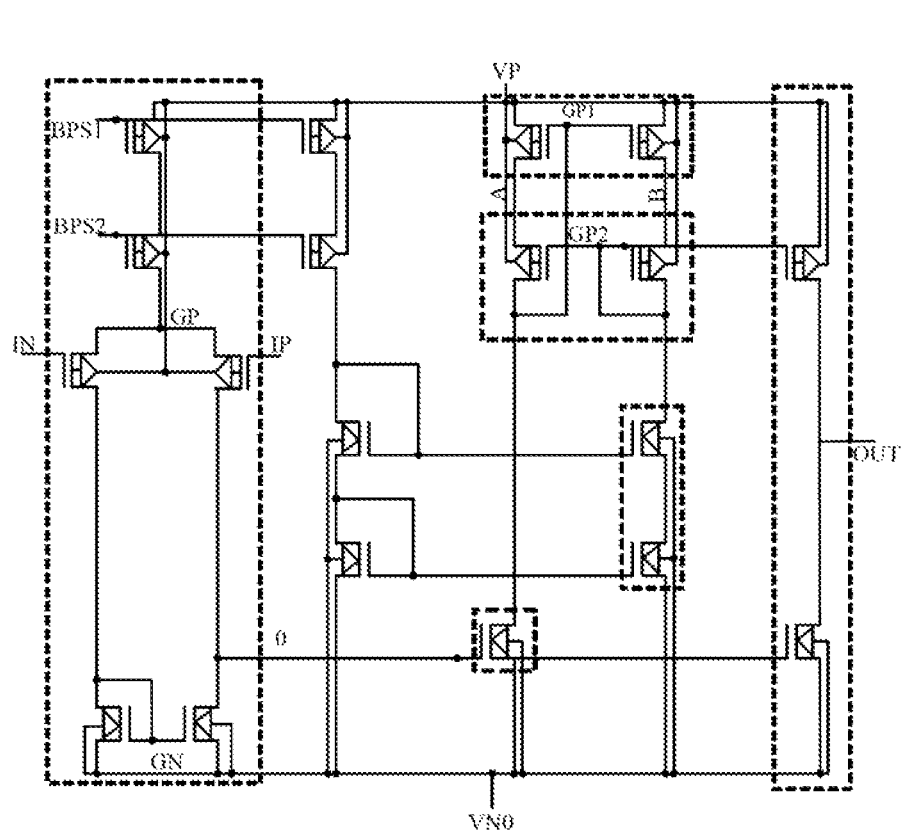
FIG. 5 shows a circuit diagram of the operational amplifier according to another embodiment of the present invention.

FIG. 4 and FIG. 5 show a schematic diagram and a circuit diagram of the operational amplifier according to another embodiment of the present invention. As shown in the figures, the difference between the operational amplifier 2 according to the present embodiment and the operational amplifier 1 in FIG. 1 is that the transistor type of the former is the inverse type of the latter. Except this, the operational principle is the same as that shown in FIG. 2. According to the description for the embodiment in FIG. 2, a person having ordinary skill in the art can deduce the operational principle of the present embodiment with ease. Thereby, the details will be described any further.

Figure 6:
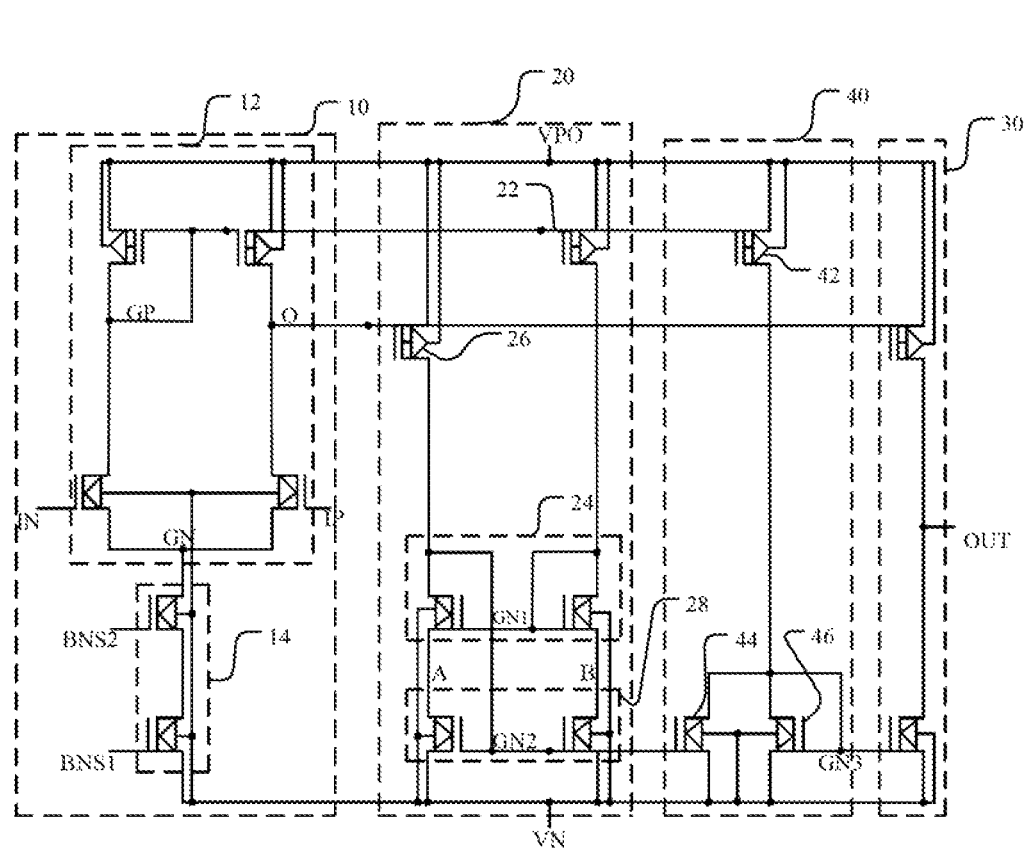
FIG. 6 shows a circuit diagram of the operational amplifier according to another embodiment of the present invention.

FIG. 6 shows a circuit diagram of the operational amplifier according to another embodiment of the present invention. As shown in the figure, the difference between the operational amplifier 3 according to the present embodiment and the one in FIG. 2 is that the operational amplifier 3 according the present embodiment is coupled between the floating current mirror circuit 20 and the output-stage circuit 30, and produces a control current according to the control signal. The output-stage circuit 30 thereby produces a driving signal according to the control signal and the control current, and produces the extremely low static current $I_{bias3}$ according to the control current for achieving the purpose of low power consumption. The current control unit 40 includes a current source 42, a third transistor 44, and a fourth transistor 46. The current source 42 is used for producing a current $I_{bias4}$. The third transistor 44 is coupled to the current source 42, and is turned on or cut off according to the control signal. The fourth transistor 46 is coupled to the current source 42 and connected in parallel with the third transistor 44. In addition, the input-stage circuit 10 according to the present embodiment includes a differential unit 12 and a current source 14. The differential unit 12 receives the input signal and produces the control signal. The current source 14 is coupled to the differential unit 12. Furthermore, the third and fourth transistors 44, 26 are used for controlling the output-stage circuit 30 to produce the driving signal or the static current. In the following FIG. 7A to 7C, the operations of driving the operational amplifier 3 according to the present embodiment to the high- and low-voltage modes and operating in static mode are described, respectively.

Figure 7A:
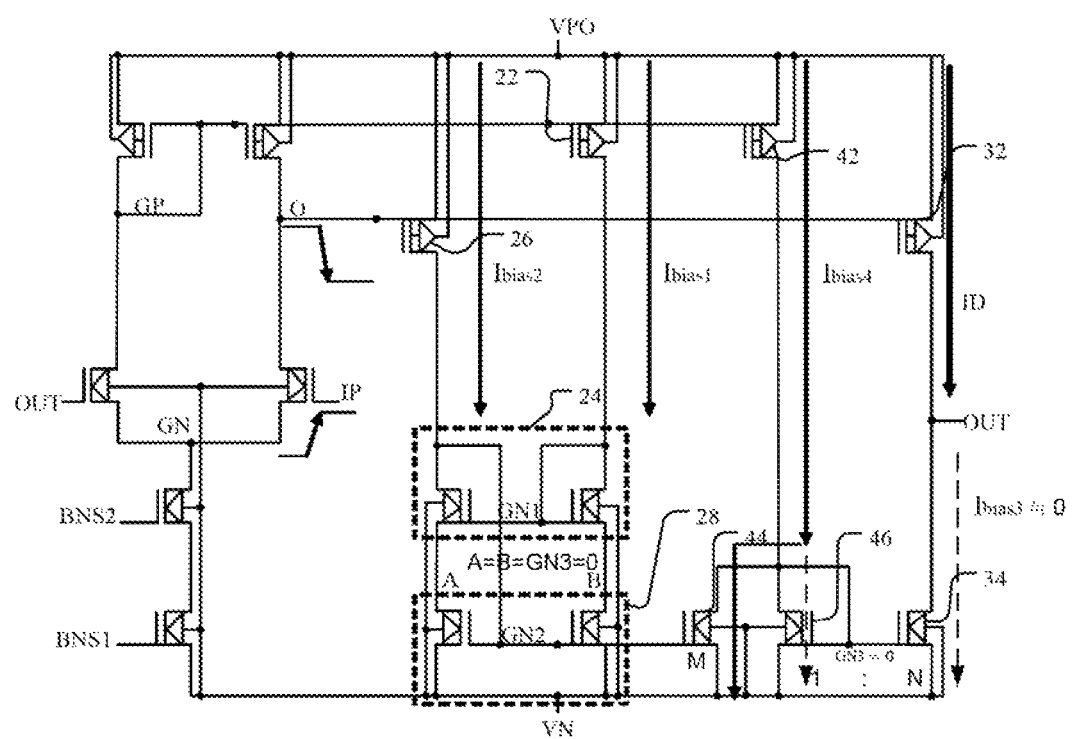
FIG. 7A shows the operation of the operational amplifier in FIG. 6 according to an embodiment of the present invention.

FIG. 7A shows the operation of the operational amplifier in FIG. 6 according to an embodiment of the present invention. As shown in the figure, the operational amplifier 3 according to the present embodiment is operating to drive to the high-voltage mode. In other words, the operational amplifier 3 outputs a high-voltage signal. The control device 26 receives the control signal and is turned on, enabling the current mirror unit 24 to operate normally and mirror the current $I_{bias1}$ of the current source 22 for producing the mirror current $I_{bias2}$. At this moment, because the voltage control unit 28 is turned on, the voltage control unit 28 is driven to operate in the linear region and thus making the voltage between the current mirror unit 24 and the voltage control unit 28 and the voltage at the node GN3 zero. That is to say, the voltage between the nodes A, B located between the current mirror unit 24 and the voltage control unit 8 is equal to the voltage at the node GN3, which is zero, and thereby the current $I_{bias3}$ flowing through the second transistor 34 of the output-stage circuit 30 approximates to zero. In addition, the first transistor 32 of the output-stage circuit 30 produces a strong driving signal $I_D$ to the output OUT, and thus making the operational amplifier 3 operate to drive to the high-voltage mode.

Figure 7B:
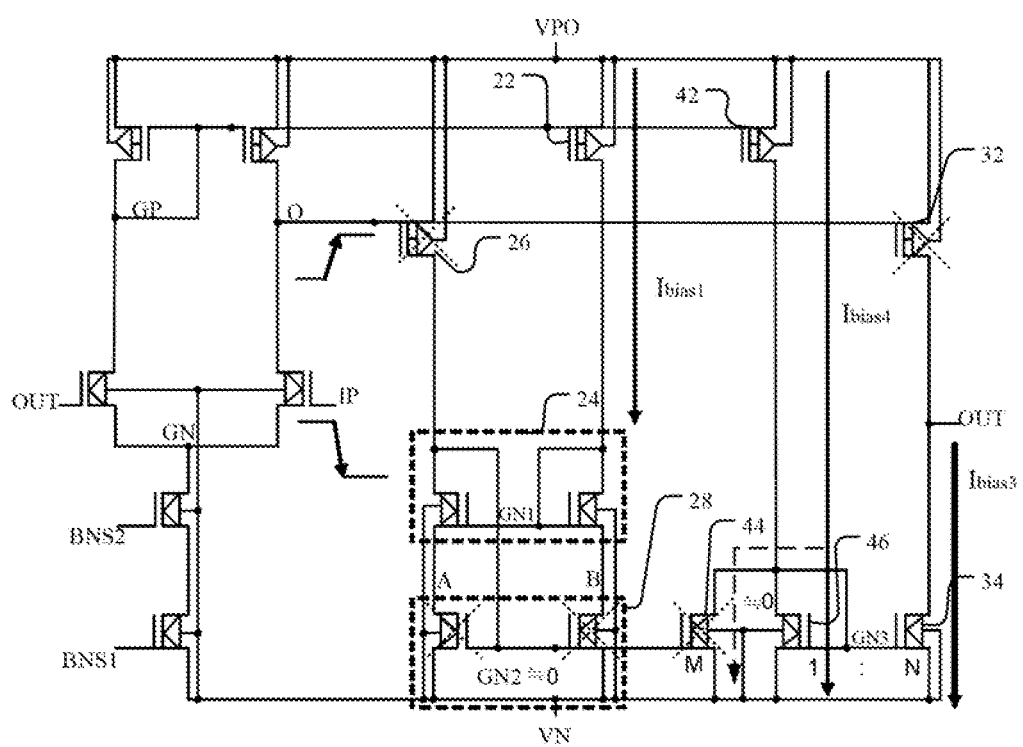
FIG. 7B shows the operation of the operational amplifier in FIG. 6 according to another embodiment of the present invention.

FIG. 7B shows the operation of the operational amplifier in FIG. 6 according to another embodiment of the present invention. As shown in the figure, the operational amplifier 3 according to the present embodiment is operating to drive to the low-voltage mode. In other words, the operational amplifier 3 outputs a low-voltage signal. The control device 26 is cut off according to the voltage level of the control signal, which makes the current mirror unit 24 stop operating and stop producing the mirror current $I_{bias2}$. According to the present embodiment, the control signal is in the high-voltage level. The gate of the control device 26 receives the control signal and then cuts off the control device 26. At this moment, because the control device 26 is cut off, the voltage control unit 28 and the third transistor 44 of the current control unit 40 are cut off accordingly. Because the third transistor 44 is cut off, the current $I_{bias4}$ produced by the current source 42 of the current control unit 40 flows through the fourth transistor 46 directly, and thus enabling the second transistor 34 to produce a driving signal with a current N-times the current $I_{bias4}$. Thereby, the output-stage circuit 30 outputs a low voltage and thus the operational amplifier 3 is operating in the low-voltage mode.

Figure 7C:
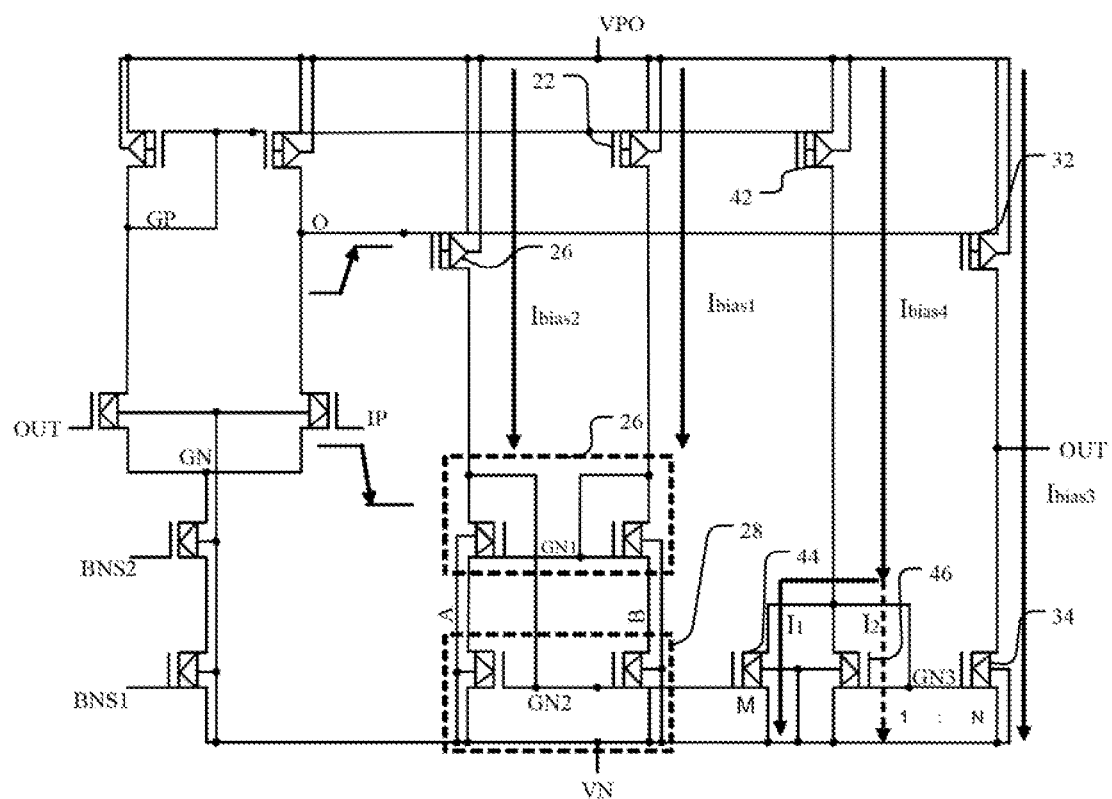
FIG. 7C shows the operation of the operational amplifier in FIG. 6 according to another embodiment of the present invention.

FIG. 7C shows the operation of the operational amplifier in FIG. 6 according to another embodiment of the present invention. As shown in the figure, the operational amplifier 3 according to the present embodiment is operating in the static mode. The control device 26 receives the control signal and is turned on, enabling the current mirror unit 24 to operate normally and mirror the current $I_{bias1}$ of the current source 22 for producing the current $I_{bias2}$. At this time, because the control device 26 is turned on, the voltage control unit 28 and the third transistor 44 are driven to operate in the saturation region. Thereby, the third transistor 44 will take away the majority of the current $I_{bias4}$. In other words, the current $I_{bias4}$ includes a first current $I_1$ and a second current $I_2$ with the first current $I_1$ greater than the second current $I_2$. Besides, the first current $I_1$ flows through the third transistor 44 while the second current $I_2$ flows through the fourth transistor 46. Then the value of the static current Iq of the output-stage circuit 30 is determined by the value of the second current $I_2$. Hence, by controlling the areas of the third and fourth transistors 44, 46, the ratio of the first current $I_1$ to the second current $I_2$ can be determined. According to the present embodiment, the area ratio of the fourth transistor 46 to the third transistor 44 and to the second transistor 34 is 1:M:N. According to the present embodiment, by making the area of the third transistor 44 greater than that of the fourth transistor 46, most of the current $I_{bias4}$ will flow through the third transistor 44; only an extremely small proportion of current will flow through the fourth transistor 46. Thereby, when the operational amplifier 3 is operating in the static mode, the static current $I_{bias3}$ can be controlled in an extremely small range and hence achieving the purpose of low power consumption.

Figure 8:
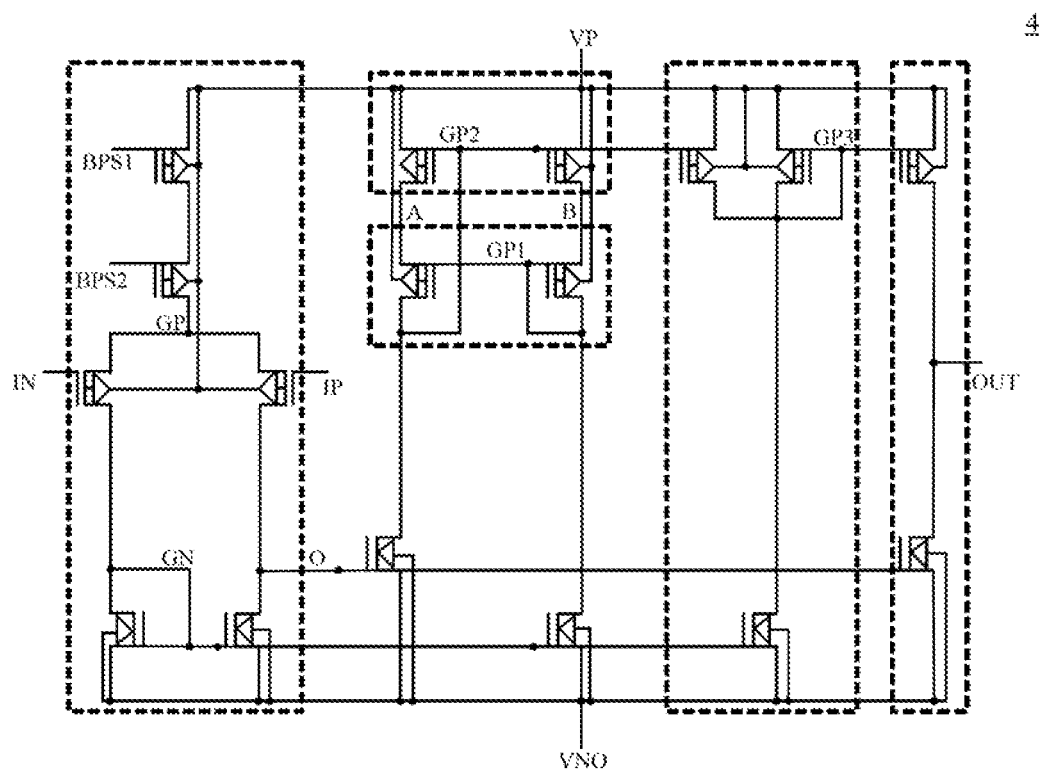
FIG. 8 shows a circuit diagram of the operational amplifier in FIG. 6 according to another embodiment of the present invention.

FIG. 8 shows a circuit diagram if the operational amplifier in FIG. 6 according to another embodiment of the present invention. As shown in the figure, the difference between the operational amplifier 4 according to the present embodiment and the operational amplifier 3 of FIG. 6 is that the transistor type of the former is the inverse type of the latter. Except this, the operational principle is the same as that shown in FIG. 6. According to the description for the embodiment in FIG. 6, a person having ordinary skill in the art can deduce the operational principle of the present embodiment with ease. Thereby, the details will be described any further.

To sum up, the operational amplifier according to the present invention comprises an input-stage circuit, a floating current mirror circuit, and an output-stage circuit. The input-stage circuit receives an input signal and produces a control signal. The floating current mirror circuit is coupled to the input-stage circuit, and produces a mirror current according to the control signal. The output-stage circuit is coupled to the floating current mirror circuit, and produces a driving signal according to the mirror current. When the operational amplifier is operating in the static mode, the output-stage circuit further produces a static current according to the mirror current. Thereby, by using the floating current mirror circuit, the purpose of low power consumption can be achieved while driving to the high-voltage mode or to the low-voltage mode.

Accordingly, the present invention conforms to the legal requirements owing to its novelty, nonobviousness, and utility. However, the foregoing description is only embodiments of the present invention, not used to limit the scope and range of the present invention. Those equivalent changes or modifications made according to the shape, structure, feature, or spirit described in the claims of the present invention are included in the appended claims of the present invention.

The invention claimed is:

1. An operational amplifier, comprising:
   an input-stage circuit, receiving an input signal, and producing a control signal;
   a floating current mirror circuit, coupled to said input-stage circuit, and producing, a mirror current according to said control signal; and
   an output-stage circuit, coupled to said floating current mirror circuit, and producing a driving signal according said control signal and said mirror current;
   wherein when said operational amplifier is operating in the static mode, said output-stage circuit further produces a static current according to said mirror current;
   wherein said floating current mirror circuit comprises: a current source, used for producing a current; a current mirror unit, coupled to said current source, and producing said mirror current according to said current produced by said current source; a control device, coupled to said input-stage circuit and said current mirror unit, and controlling said current mirror unit to produce said mirror current according to said control signal; and a voltage control unit, coupled to said control device and said current mirror unit, and controlling said output-stage circuit to produce said driving signal or said static current according to said control signal.

2. The operational amplifier of claim 1, wherein said output-stage circuit comprises: a first transistor, coupled to said input-stage circuit, and controlled by said control signal; and a second transistor, coupled to said first transistor and said floating current mirror circuit, and controlled by said mirror current.

3. The operational amplifier of claim 1, wherein said input-stage circuit comprises: a differential unit, having two inputs, with one input coupled to an out of said operational amplifier and the other input receiving said input signal, and producing said control signal; and a current source, coupled to said differential unit.

4. An operational amplifier, comprising:
   an input-stage circuit, receiving an input signal, and producing a control signal;
   a floating current mirror circuit, coupled to said input-stage circuit, and producing, a mirror current according to said control signal;
   a current control unit, coupled to said floating current mirror circuit, and producing a control current according to said mirror current; and
   an output-stage circuit, coupled to said floating current mirror circuit, and producing a driving signal according said control signal and said control current;
   where when said operational amplifier is operating in the static mode, said output-stage circuit further produces a static current according to said control current;
   wherein said floating current mirror circuit comprises: a current source, used for producing to current; a current mirror unit, coupled to said current source, and producing said mirror current according to said current produced by said current source; a control device, coupled to said input-stage circuit and said current mirror unit, and controlling said current mirror unit to produce said mirror current according to said control signal; and a voltage control unit, coupled to said control device and said current mirror unit, and controlling said output-stage circuit to produce said driving signal or said static current according to said control signal.

5. The operational amplifier of claim 4, wherein said current control unit comprises: a current source, used for producing a current; a first transistor, coupled to said current source, and turned on or cut off according to said mirror current; and a second transistor, coupled to said current source, and connected in parallel with said first transistor; where said first transistor and said second transistor control said output-stage circuit to produce said driving signal or said static current.

6. The operational amplifier of claim 5, wherein the area of said first transistor is greater than the area of said second transistor.

7. The operational amplifier of claim 4, wherein said output-stage circuit comprises: a first transistor, coupled to said input-stage circuit, and controlled by said control signal; and a second transistor, coupled to said first transistor and said floating current mirror circuit, and controlled by said mirror current.

8. The operational amplifier of claim 4, wherein said input-stage circuit comprises: a differential unit, receiving said input signal, and producing said control signal; and a current source, coupled to said differential unit.

* * * * *